(12) United States Patent
Choi et al.

(10) Patent No.: US 7,754,549 B2
(45) Date of Patent: Jul. 13, 2010

(54) METHOD OF MANUFACTURING THIN FILM TRANSISTOR ARRAY PANEL

(75) Inventors: Jae-Beom Choi, Suwon-si (KR);
Young-jin Chang, Yongin-si (KR);
Yoon-Seok Choi, Suwon-si (KR);
Seung-Hwan Shim, Seongnam-si (KR);
Han-Na Jo, Cheongju-si (KR);
Jung-Hoon Shin, Daejeon-si (KR);
Joon-Young Koh, Gangreung-si (KR)

(73) Assignees: Samsung Electronics Co., Ltd. (KR);
Korea Advanced Institute of Science and Technology (KR)

( * ) Notice: Subject to any disclaimer, the term of this patent is extended or adjusted under 35 U.S.C. 154(b) by 55 days.

(21) Appl. No.: 11/839,683

(22) Filed: Aug. 16, 2007

(65) Prior Publication Data

US 2008/0044965 A1 Feb. 21, 2008

(30) Foreign Application Priority Data

Aug. 16, 2006 (KR) .................. 10-2006-0077295

(51) Int. Cl.
*H01L 29/786* (2006.01)
(52) U.S. Cl. .................. 438/166; 257/E29.293
(58) Field of Classification Search .................. 438/166, 438/486, 150, 197, 293; 257/E29.292, E29.293, 257/E29.299
See application file for complete search history.

(56) References Cited

U.S. PATENT DOCUMENTS 5,550,066 A * 8/1996 Tang et al. .................. 438/29

| 2004/0166655 | A1 * | 8/2004 | Wong et al. .................. 438/486 |
| 2006/0040429 | A1 | 2/2006 | Park et al. |
| 2006/0063315 | A1 | 3/2006 | Shin |
| 2006/0073648 | A1 * | 4/2006 | Park et al. .................. 438/166 |

FOREIGN PATENT DOCUMENTS

| JP | 2006093648 | 4/2006 |
| JP | 2006108608 | 4/2006 |
| KR | 1020030066181 | 8/2003 |
| KR | 1020040038237 | 5/2004 |
| KR | 1020050117467 | 12/2005 |

(Continued)

*Primary Examiner*—W. David Coleman
*Assistant Examiner*—Daniel Shook
(74) *Attorney, Agent, or Firm*—Cantor Colburn LLP

(57) ABSTRACT

A method of manufacturing a thin film transistor array panel includes forming an amorphous silicon film on an insulating substrate; forming a sacrificial film having an embossed surface on the amorphous silicon film; contacting a metal plate with the sacrificial film and performing heat-treatment for crystallizing the amorphous silicon film to change the amorphous silicon film to a polycrystalline silicon film; removing the metal plate and the sacrificial film; patterning the polycrystalline silicon film to form a semiconductor; forming a gate insulating layer which covers the semiconductor; forming a gate line on the gate insulating layer, a portion of the gate line overlapping the semiconductor; heavily doping a conductive impurity into portions of the semiconductor to form a source region and a drain region; forming an interlayer insulating layer which covers the gate line and the semiconductor; and forming a data line and an output electrode connected to the source and drain regions, respectively, on the interlayer insulating layer.

16 Claims, 13 Drawing Sheets

FOREIGN PATENT DOCUMENTS

| | | |
|---|---|---|
| KR | 1020060012850 | 2/2006 |
| KR | 1020060015183 | 2/2006 |
| KR | 1020060015195 | 2/2006 |
| KR | 1020060015196 | 2/2006 |
| KR | 1020060017410 | 2/2006 |
| KR | 1020060017424 | 2/2006 |
| KR | 1020060018533 | 3/2006 |
| KR | 1020060018780 | 3/2006 |
| KR | 1020060025624 | 3/2006 |
| KR | 1020060027243 | 3/2006 |

* cited by examiner

METHOD OF MANUFACTURING THIN FILM TRANSISTOR ARRAY PANEL

This application claims priority to Korean Patent Application No. 10-2006-0077295, filed on Aug. 16, 2006, and all the benefits accruing therefrom under 35 U.S.C. § 119, the contents of which in its entirety are herein incorporated by reference.

BACKGROUND OF THE INVENTION (a) Field of the Invention

The present invention relates to a method of manufacturing a thin film transistor array panel, and, in particular, to a method of manufacturing a thin film transistor array panel having a polycrystalline silicon semiconductor.

(b) Description of the Related Art

A thin film transistor ("TFT") array panel is used as the substrate of a data driver circuit configured to individually drive each pixel in a flat panel display composed of a plurality of pixels, such as a liquid crystal display ("LCD") or an organic light emitting device ("OLED").

A liquid crystal display ("LCD") includes two panels (e.g., substrates) each provided with field-generating electrodes (such as pixel electrodes and a common electrode), with a liquid crystal ("LC") layer interposed therebetween. The LCD displays images by applying voltages to the field-generating electrodes to generate an electric field across the LC layer, which controls the orientations of LC molecules in the LC layer to adjust transmittance of incident light through the two panels.

Generally, the TFT includes a semiconductor made of amorphous silicon or polycrystalline silicon.

Amorphous silicon is widely used in a display device having glass with a melting point which is low, since an amorphous silicon film can be fabricated at a relatively low temperature.

For crystallizing amorphous silicon to form a polycrystalline silicon film, either an excimer laser anneal ("ELA") process, a chamber anneal process, a sequential lateral solidification ("SLS") process, a metal-induced crystallization ("MIC") process, and a metal-induced lateral crystallization ("MILC") process are used.

The MIC or MILC processes form the polycrystalline silicon film by contacting portions of the amorphous silicon film with a metal. At this time, metal atoms move into the amorphous silicon film to perform crystallization of amorphous silicon. The MIC and MILC processes have advantages which include low cost and TFTs obtained with uniform characteristics, as compared with the remaining processes using a laser.

However, the MIC or MILC processes require forming of a metal film on the amorphous silicon film, and in particular, the MILC process requires an additional patterning process. Furthermore, after the crystallization, the metal atoms remain in channel regions or junction region between source and drain regions of TFTs due to the metal atoms moving into the amorphous silicon film and use of a catalyst. Thereby, leakage current occurs as a result of the remaining metal atoms between the source and drain regions of the respective TFTs.

BRIEF SUMMARY OF THE INVENTION

An exemplary embodiment of the present invention provides a method of manufacturing a thin film transistor array panel. The method includes forming an amorphous silicon film on an insulating substrate; forming a sacrificial film having an embossed surface on the amorphous silicon film; contacting a metal plate with the sacrificial film and performing heat-treatment for crystallizing the amorphous silicon film to change the amorphous silicon film to a polycrystalline silicon film; removing the metal plate and the sacrificial film; patterning the polycrystalline silicon film to form a semiconductor; forming a gate insulating layer which covers the semiconductor, forming a gate line on the gate insulating layer, a portion of the gate line overlapping the semiconductor; heavily doping a conductive impurity into portions of the semiconductor to form a source region and a drain region; forming an interlayer insulating layer which covers the gate line and the semiconductor; and forming a data line and an output electrode connected to the source and drain regions on the interlayer insulating layer.

The embossed surface may have protrusions and depressions which are regularly formed.

The sacrificial film has a thickness of about several tens to about several thousands of angstroms.

The sacrificial film may be made of one of SiON, $SiO_2$ and SiNx.

The metal plate may be a nickel plate.

BRIEF DESCRIPTION OF THE DRAWINGS

The present invention will become more apparent by describing exemplary embodiments thereof in further detail with reference to the accompanying drawings, in which.

DETAILED DESCRIPTION OF THE INVENTION

Figure 1:
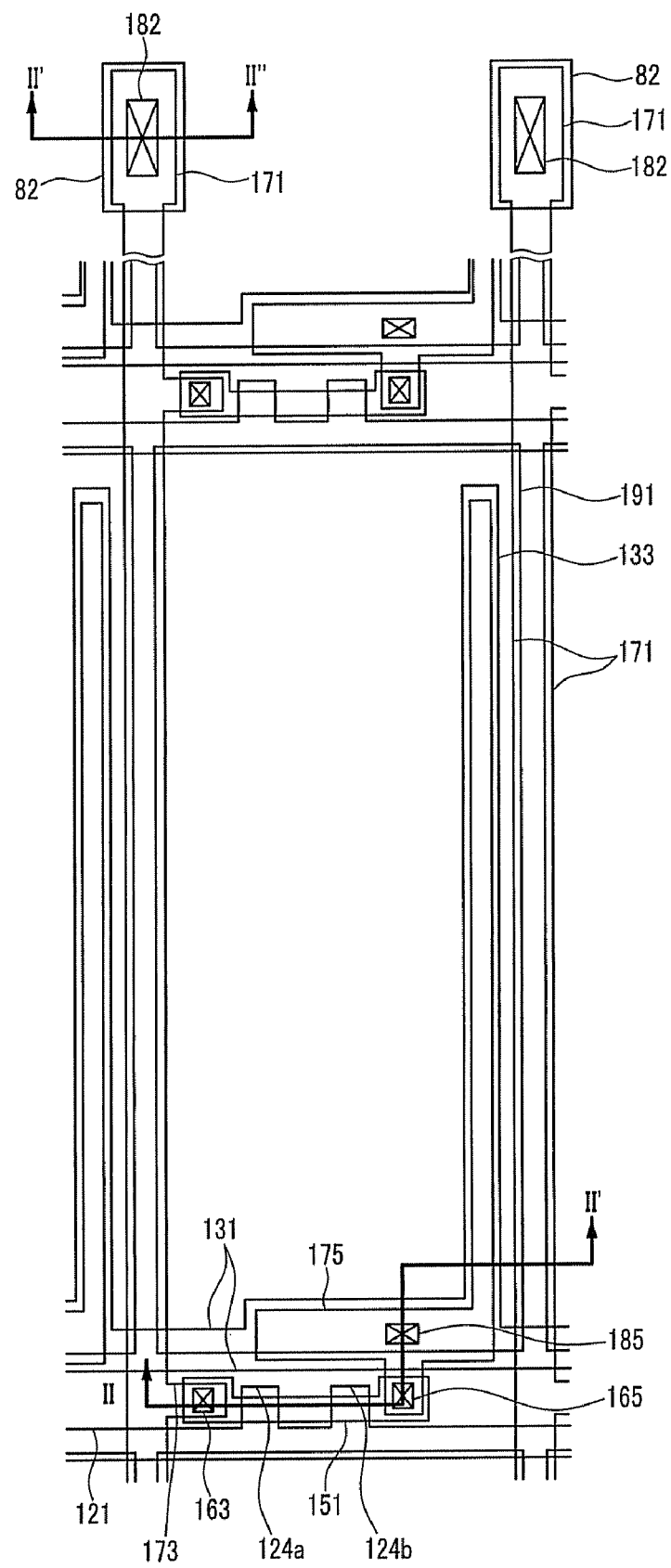
FIG. 1 is a plan view layout of an exemplary embodiment of a TFT array panel according to the present invention.

The present invention now will be described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

An exemplary embodiment of a TFT array panel for a liquid crystal display ("LCD") according to the present invention will be described with reference to FIGS. 1 and 2.

FIG. 1 is a plan view layout of an exemplary embodiment of a TFT array panel according to the present invention. FIG. 2 is a cross-sectional view of the TFT array panel shown in FIG. 1 taken along line II-II'-II".

Figure 2:
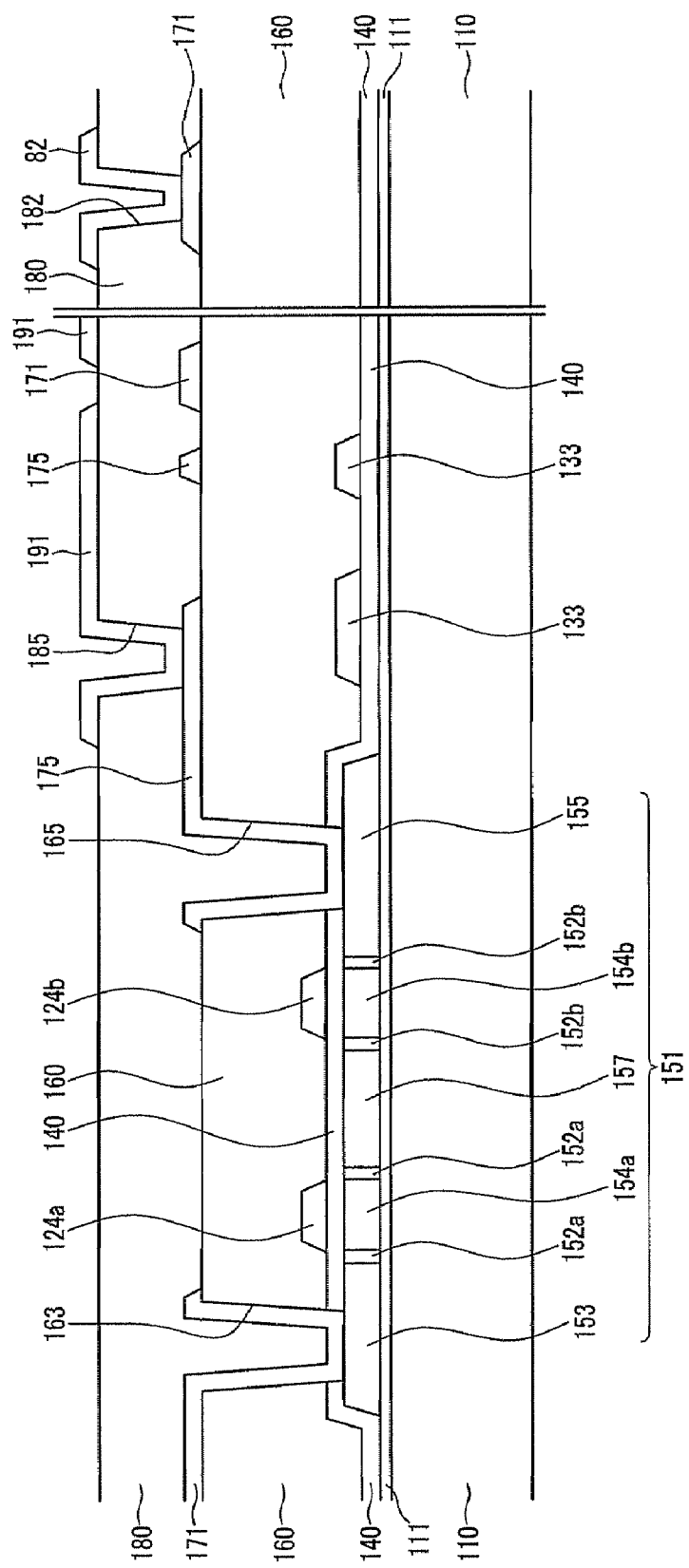
FIG. 2 is a cross-sectional view of the exemplary TFT array panel shown in FIG. 1 taken along line II-II'-II"

Referring to FIGS. 1 and 2, a blocking film 111 preferably made of silicon oxide ("SiOx") or silicon nitride ("SiNx") is formed on an insulating substrate 110 of a material such as transparent glass or plastic, for example. The blocking film 111 may have a multilayered structure.

In exemplary embodiments, a plurality of semiconductor islands 151 made of polycrystalline silicon are formed on the blocking film 111. Each of the semiconductor islands 151 has a rectangular shape and end portions. The end portions have a width wider than other portions of the semiconductors 151 for making connections with other layers.

In this exemplary embodiment, amorphous silicon is crystallized by an MIC process to form the semiconductor islands 151. Thereby, the semiconductor islands 151 may include metal atoms therein, and the density of the metal atoms in the semiconductor islands 151 may be different.

Each of the semiconductor islands 151 includes a plurality of extrinsic regions containing conductive impurities and at least one intrinsic region containing less of the conductive impurities. The extrinsic regions include heavily doped regions and lightly doped regions depending on doped impurity amount.

The intrinsic region includes channel regions 154a and 154b separated from each other.

The heavily doped regions include a plurality of source or drain regions 153, 155 and 157 separated from the channel regions 154a and 154b.

The lightly doped regions 152a and 152b have relatively small thicknesses and lengths compared with the heavily doped regions 153, 155 and 157 and are disposed between the heavily doped regions 153, 155 and 157 and the channel regions 154a and 154b. The lightly doped regions 152a and 152b are referred to as "lightly doped drain ("LDD") regions". Examples of the conductive impurities include P-type impurities such as boron (B) and gallium (Ga) and N-type impurities such as phosphorous (P) and arsenic (As). The lightly doped regions 152a and 152b prevent leakage current or a punch through phenomenon of TFTs, and they may be replaced with offset regions which contain substantially no impurities.

A gate insulating layer 140 made of silicon oxide ("SiOx") or silicon nitride ("SiNx") is formed on the semiconductor islands 151 and the blocking film 111.

A plurality of gate conductors including a plurality of gate lines 121 and a plurality of storage electrode lines 131 are formed on the gate insulating layer 140.

The gate lines 121 for transmitting gate signals extend substantially in a transverse or horizontal direction, as illustrated in FIG. 1. Portions of the gate lines 121 include a plurality of gate electrodes 124a and 124b protruding upward, as illustrated in FIG. 1. The gate electrodes 124a and 124b overlap the channel regions 154a and 154b of the semiconductor islands 151, as illustrated in FIG. 2. The gate electrodes 124a and 124b may overlap the lightly doped regions 152a and 152b.

Each gate line 121 may include an end portion having a large area for contact with another layer or an external driving circuit (not shown). The gate lines 121 may extend to be directly connected to a gate driving circuit (not shown) for generating the gate signals, which may be integrated with the substrate 110.

The storage electrode lines 131 are disposed between the two adjacent gate lines 121, and proximate to the lower of the two adjacent gate lines 121.

The storage electrode lines 131 include a plurality of storage electrodes 133 extending to the neighboring gate lines 121 in a longitudinal direction, as illustrated in FIG. 1, and are supplied with a predetermined voltage such as a common voltage which is applied to a common electrode (not shown).

The gate lines 121 and the storage electrode lines 131 are preferably made of an Al-containing metal such as Al or an Al alloy (e.g. Al—Nd), a Ag-containing metal such as Ag or a Ag alloy, a Cu-containing metal such as Cu or a Cu alloy, a Mo-containing metal such as Mo or a Mo alloy, Cr, Ta, Ti, etc. The gate conductors 121 and 124b and the storage electrode lines 131 may have a multi-layered structure including two films having different physical characteristics. One of the two films is preferably made of a low resistivity metal including an Al-containing metal, a Ag-containing metal, or a Cu-containing metal for reducing signal delay or voltage drop. The other film is preferably made of a material such as a Mo-containing metal, Cr, Ta, or Ti, which has good physical, chemical and electrical contact characteristics with other materials such as indium tin oxide ("ITO") or indium zinc oxide ("IZO"). Good examples of the combination are a lower Cr film and an upper Al (alloy) film or a lower Al (alloy) film and an upper Mo (alloy) film. However, the gate lines 121 and the storage lines 131 may be made of various other metals or conductors.

The lateral sides of the gate lines 121 and the storage electrode lines 131 are inclined relative to the surface of the substrate 110 to enhance overlying adhesion characteristics.

An interlayer insulating layer 160 is formed on the gate conductors 121 and 131. In exemplary embodiments, the interlayer insulating layer 160 is made of a photosensitive organic material having a good flatness characteristic, a low dielectric insulating material such as a-Si:C:O or a-Si:O:F formed by plasma enhanced chemical vapor deposition ("PECVD"), or an inorganic material such as silicon nitride or silicon oxide.

The interlayer insulating layer 160 has a plurality of contact holes 163 and 165 respectively exposing the source regions 153 and the drain regions 155.

A plurality of data conductors including a plurality of data lines 171 and a plurality of output electrodes 175 are formed on the interlayer insulating layer 160.

The data lines 171 are provided for transmitting data voltages and extend substantially in the longitudinal direction to cross the gate lines 121, as illustrated in FIG. 1. Each data line 171 includes a plurality of input electrodes 173 extending to electrically connect to the source regions 153 through the contact holes 163. Each data line 171 includes an expanded end portion having a large area for contact with another layer or an external driving circuit (not shown). The data lines 171 may be directly connected to a data driving circuit (not shown) for generating the gate signals, which may be integrated with the substrate 110. The storage electrodes 133 are disposed between two adjacent data lines 171.

The output electrodes 175 are separated from the input electrodes 173 and are connected to the drain regions 155 through the contact holes 165.

In exemplary embodiments, the data conductors 171 and 175 are made of a refractory metal including Cr, Mo, Ti, Ta, or alloys thereof. They may have a multi-layered structure preferably including a low resistivity film and a good contact film. A good example of the multi-layered structure includes a Mo lower film, an Al middle film and a Mo upper film, as well as the above-described combinations of a Cr lower film and an Al—Nd upper film or an Al lower film and a Mo upper film.

Like the gate conductors 121 and 131, the data conductors 171 and 175 have tapered lateral sides relative to a surface of the substrate 110.

A passivation layer 180 is formed on the data conductors 171 and 175 and the interlayer insulating layer 160. The passivation layer 180 is also preferably made of a photosensitive organic material having a good flatness characteristic, an insulating material having low (4.0 or less) dielectric constant such as a-Si:C:O or a-Si:O:F formed by PECVD, or an inorganic material such as silicon nitride or silicon oxide. The passivation layer 180 may include a lower film made of an inorganic material and an upper film made of an organic material.

The passivation layer 180 has a plurality of contact holes 185 and 182 exposing the output electrodes 175 and end portions of the data lines 171, respectively. The passivation layer 180 and the interlayer insulating layer 160 may further have a plurality of contact holes (not shown) exposing end portions of the gate lines 121.

In exemplary embodiments, a plurality of pixel electrodes 191 and a plurality of contact assistants 82 made of at least one of a transparent conductor, such as ITO or IZO, and an opaque reflective conductor, such as Al or Ag, are formed on the passivation layer 180.

The pixel electrodes 191 are physically and electrically connected to the output electrodes 175 through the contact holes 185 such that the pixel electrodes 191 receive the data voltages from the drain regions 155 via the output electrodes 175.

The contact assistants 82 are connected to the end portions of the data lines 171 through the contact holes 182. The contact assistants 82 protect the end portions and enhance the adhesion between the end portions and external devices.

The pixel electrodes 191 supplied with the data voltages generate electric fields in cooperation with the common electrode (not shown) disposed on the upper panel (not shown), which determines the orientations of liquid crystal ("LC") molecules in a liquid crystal layer (not shown).

In the liquid display, a pixel electrode 191 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by the pixel electrodes 191 overlapping the storage electrodes 133, as well as the storage lines 131. The storage electrodes 133 may be omitted depending on the required amount of the capacitance.

The pixel electrodes 191 overlap the gate lines 121 and the data lines 171 to increase the aperture ratio, but this overlap is optional.

A method of manufacturing the TFT array panel shown in FIGS. 1 and 2 will be described with reference to FIGS. 3 to 13.

Figure 3:
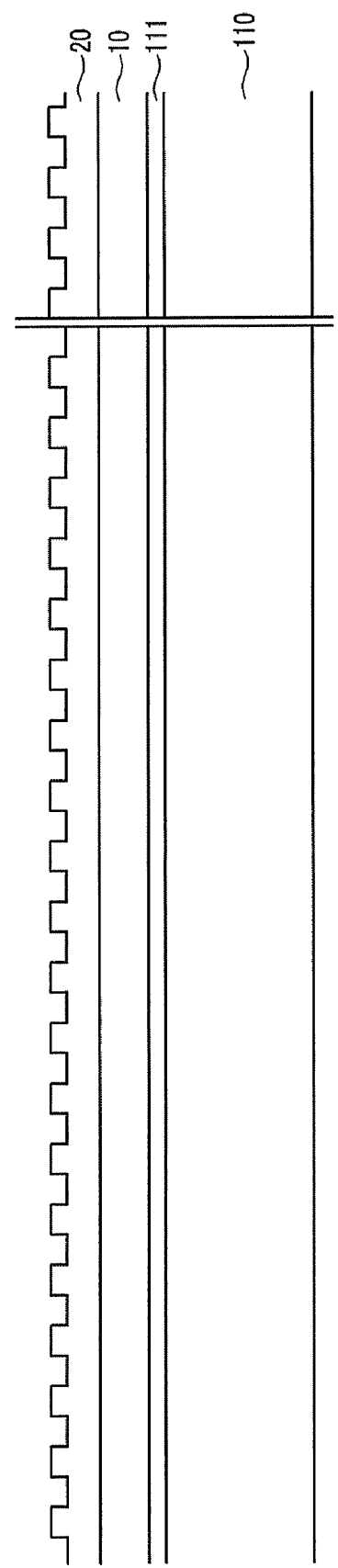
FIG. 3 is a cross-sectional view of the exemplary TFT array panel shown in FIGS. 1 and 2 in an intermediate step of a method of manufacturing thereof according to an exemplary embodiment of the present invention.
Figure 4:
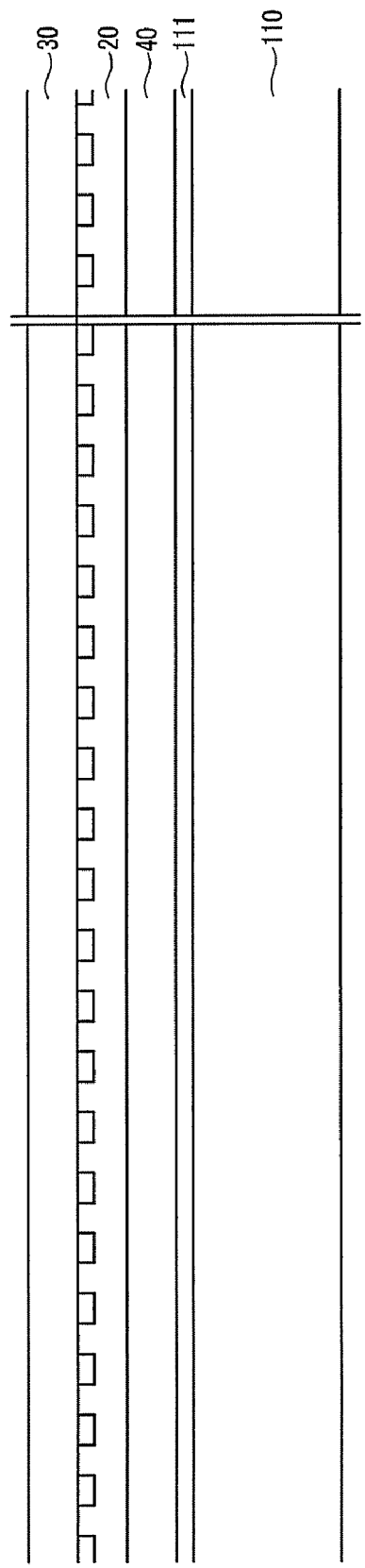
FIG. 4 is a cross-sectional view illustrating a processing step following the step shown in FIG. 3.
Figure 5:
FIG. 5 is a plan view layout of the exemplary TFT array panel in a processing step following the step shown in FIG. 4.
Figure 5:
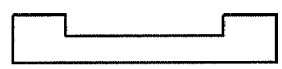
Figure 5:
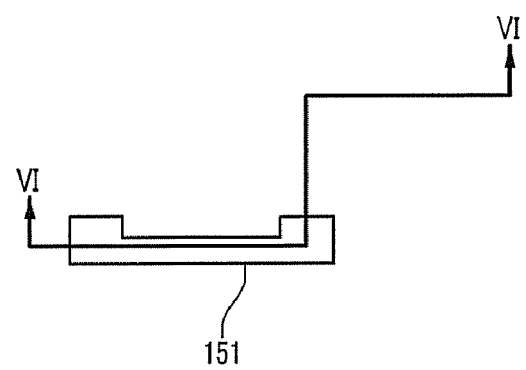
Figure 6:
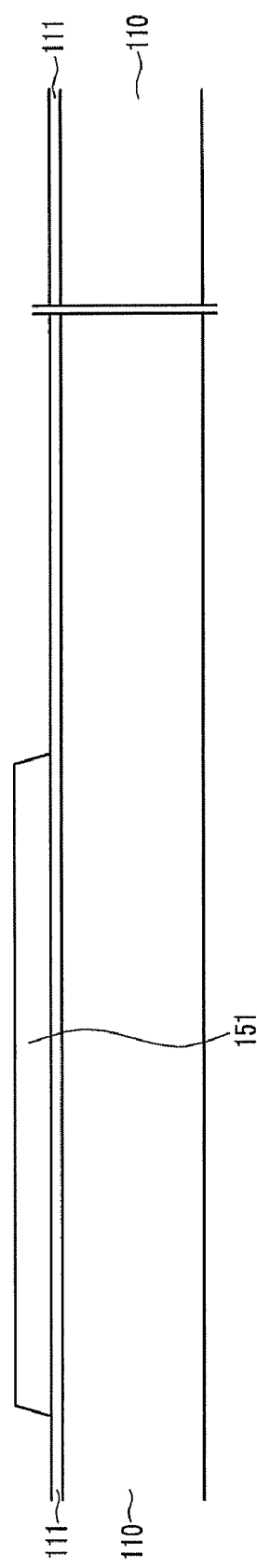
FIG. 6 is a cross-sectional view of the exemplary TFT array panel shown in FIG. 5 taken along line V-V'-V"
Figure 7:
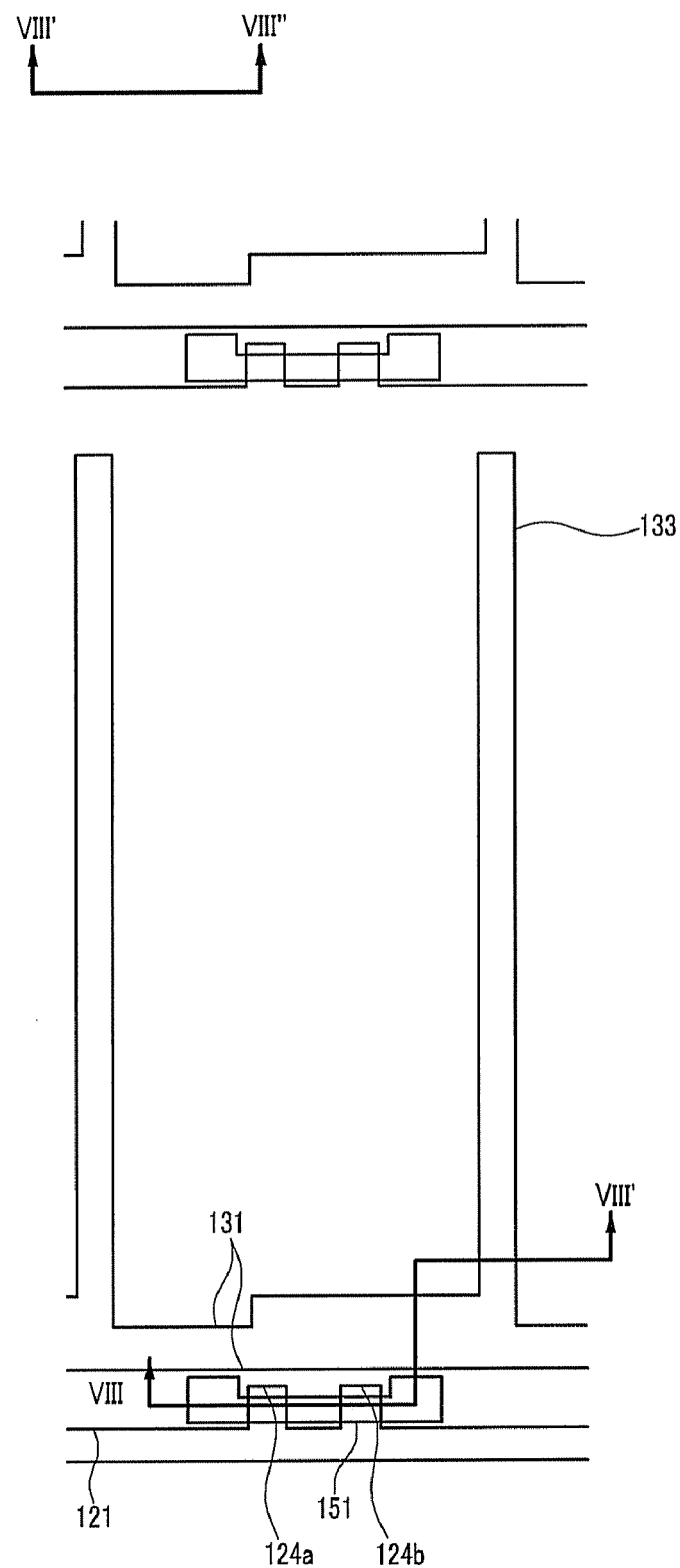
FIG. 7 is a plan view layout of the exemplary TFT array panel in a processing step following the step shown in FIG. 6.
Figure 8:
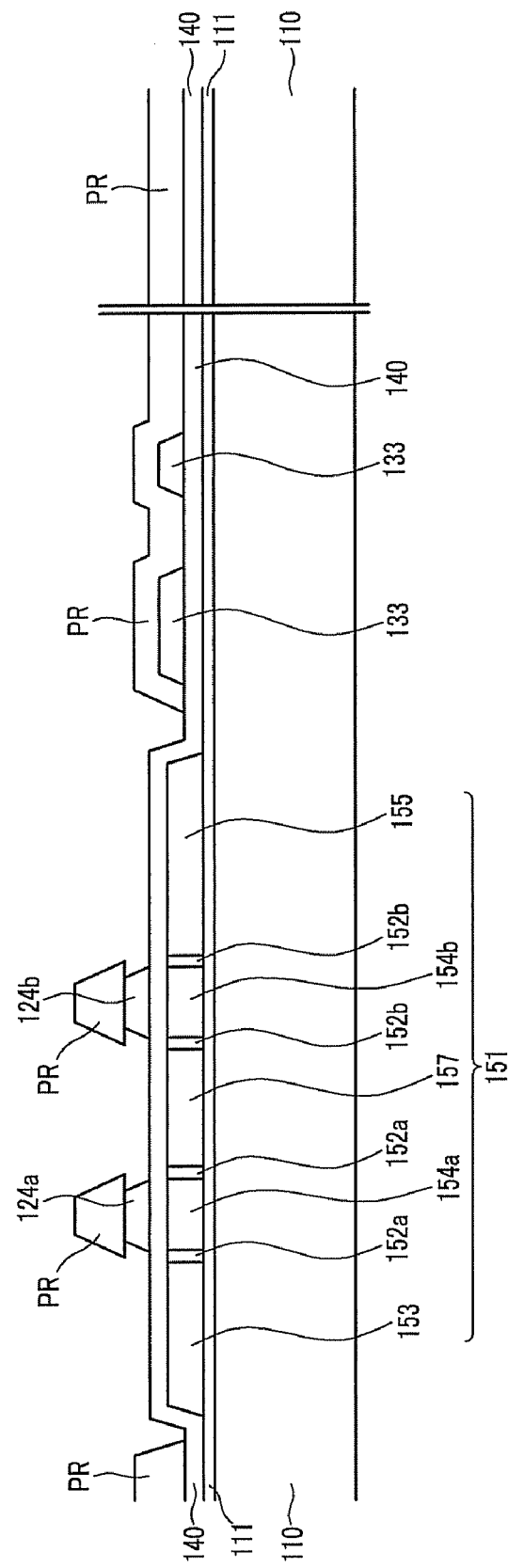
FIG. 8 is a cross-sectional view of the exemplary TFT array panel shown in FIG. 7 taken along line VII-VII'-VII"
Figure 9:
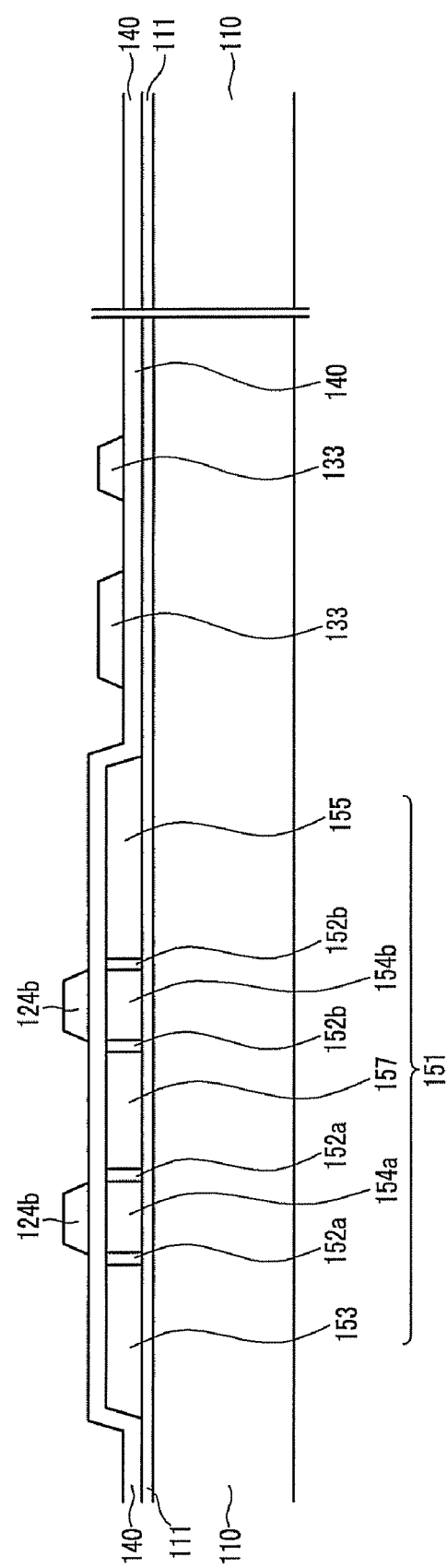
FIG. 9 is a cross-sectional view of the exemplary TFT array panel shown in FIG. 8 illustrating a processing step following the step shown in FIG. 8.
Figure 10:
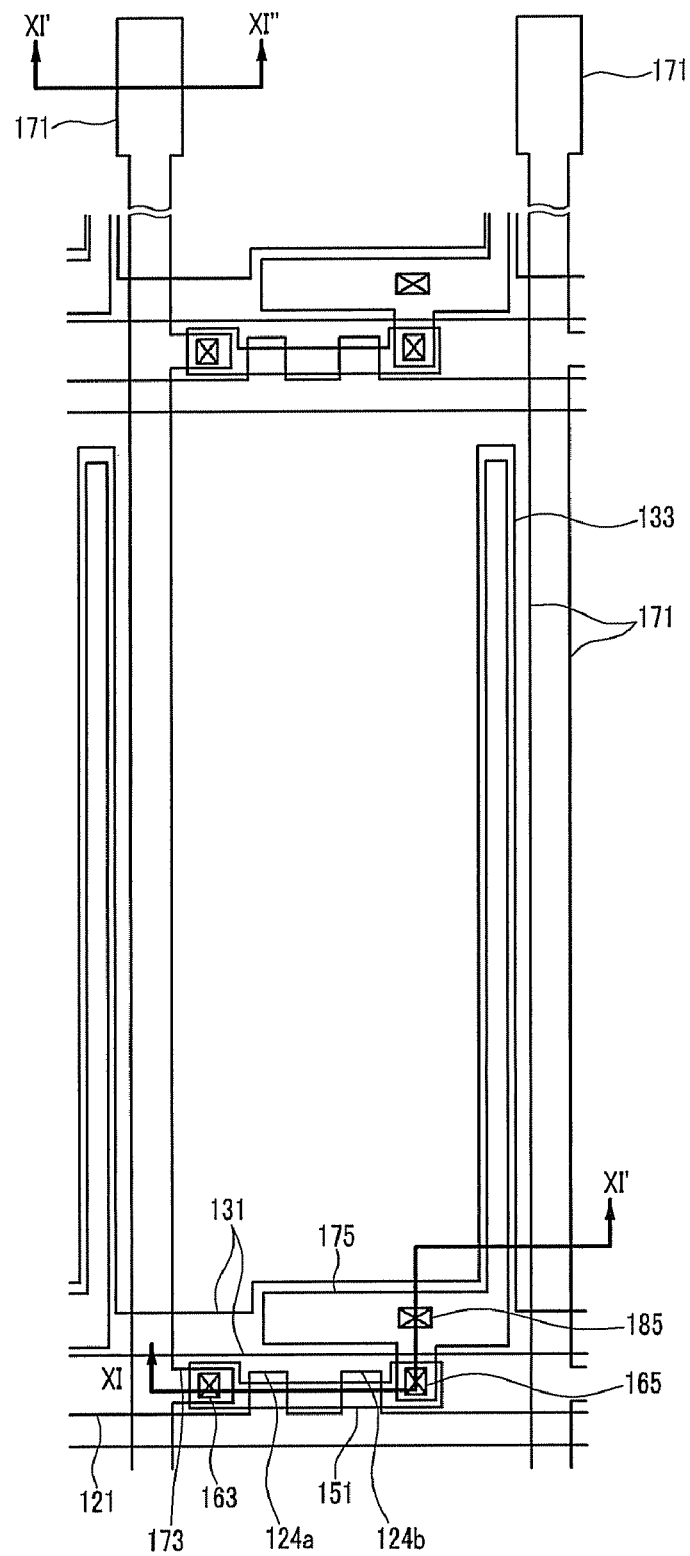
FIG. 10 is a plan view layout of the exemplary TFT array panel in a processing step following the step shown in FIG. 9.
Figure 11:
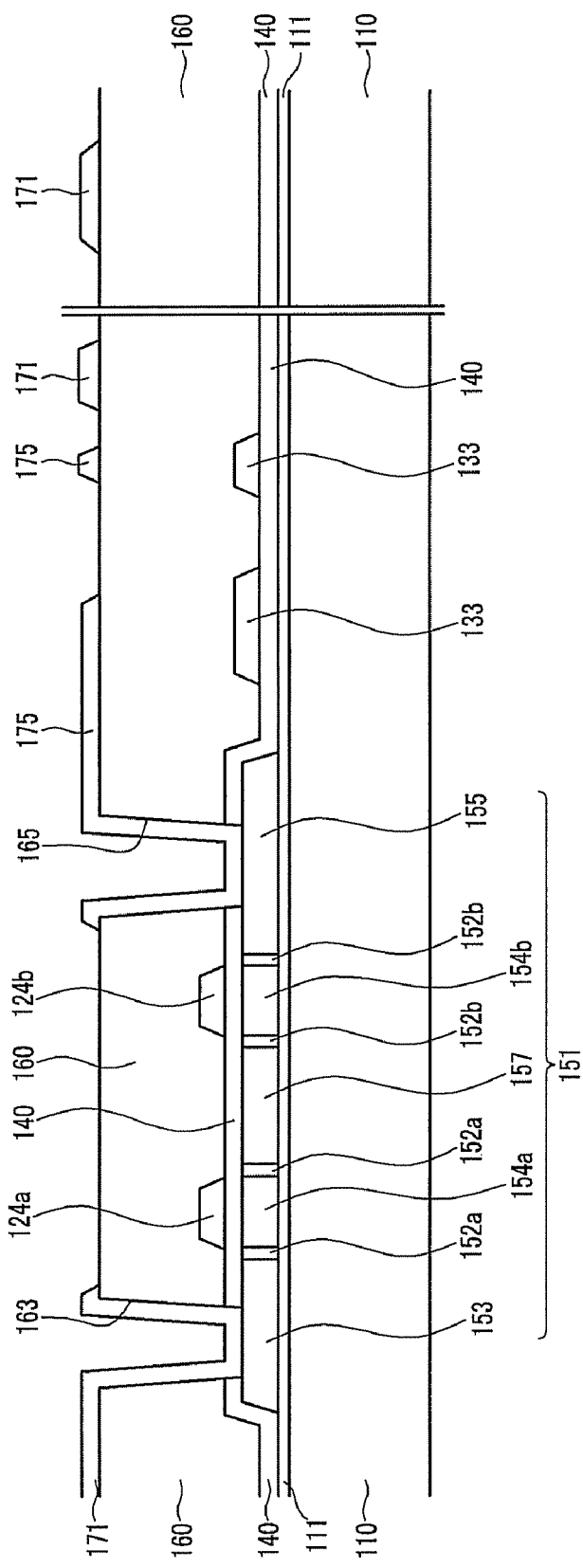
FIG. 11 is a cross-sectional view of the exemplary TFT array panel shown in FIG. 10 taken along line XI-XI'-XI"
Figure 12:
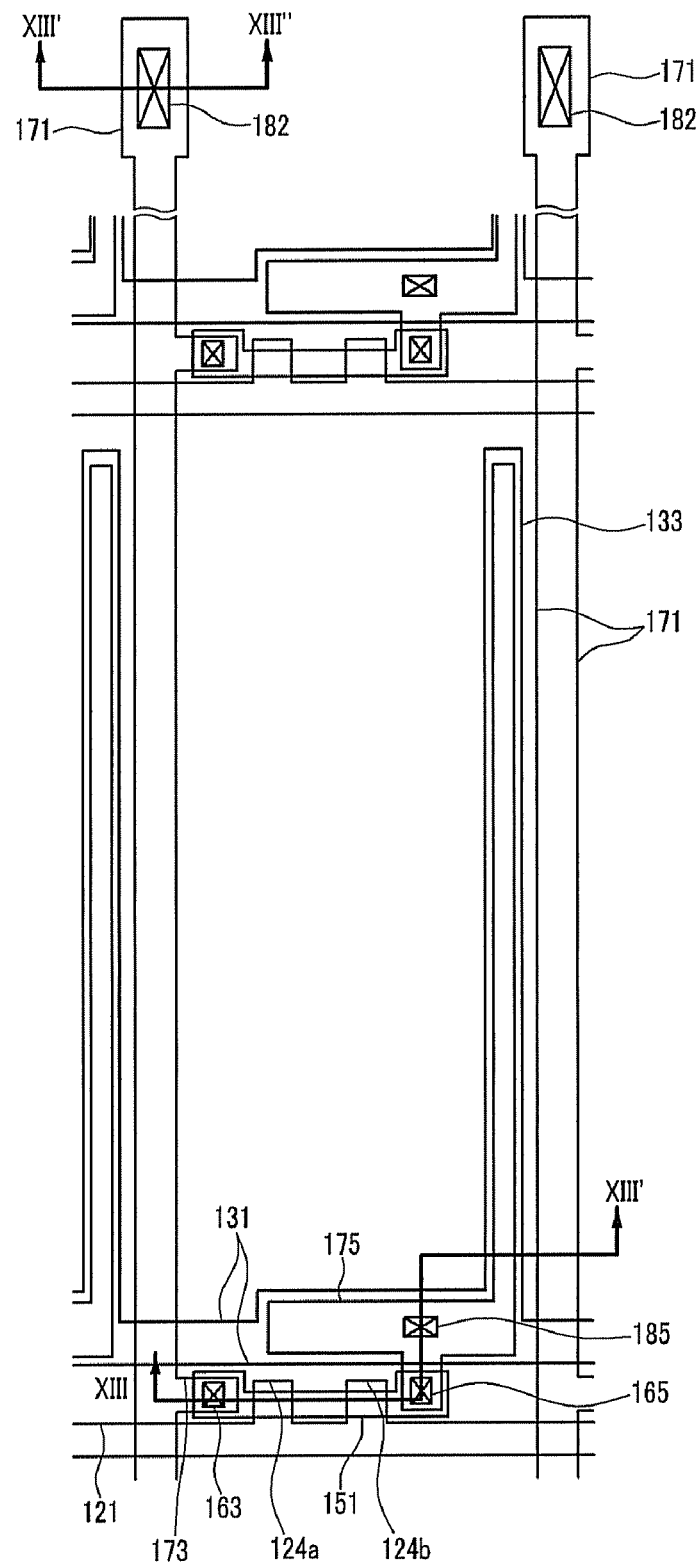
FIG. 12 is a plan view layout of the exemplary TFT array panel in a processing step following the step shown in FIG. 10.
Figure 13:
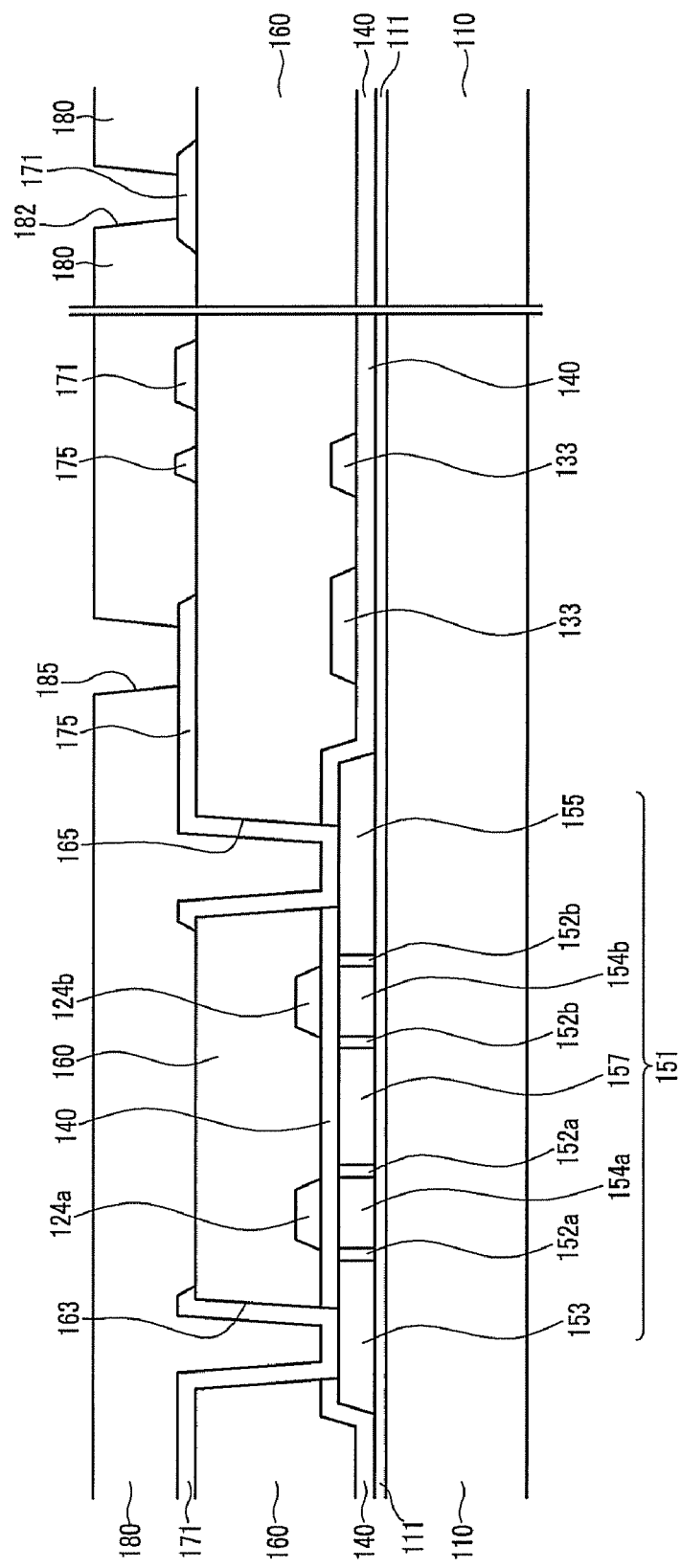
FIG. 13 is a cross-sectional view of the TFT array panel shown in FIG. 12 taken along line XIII-XIII'-XIII".

FIG. 3 is a cross-sectional view of the exemplary TFT array panel shown in FIGS. 1 and 2 in an intermediate step of a method of manufacturing thereof according to an exemplary embodiment of the present invention, FIG. 4 is a cross-sectional view of the exemplary TFT array panel illustrating a processing step following the step shown in FIG. 3, FIG. 5 is a plan view layout of the exemplary TFT array panel in a processing step following the step shown in FIG. 4, FIG. 6 is a cross-sectional view of the exemplary TFT array panel shown in FIG. 5 taken along line V-V'-V", FIG. 7 is a plan view layout of the exemplary TFT array panel in a processing step following the step shown in FIG. 6, FIG. 8 is cross-sectional view of the exemplary TFT array panel shown in FIG. 7 taken along line VIII-VIII'-VIII", FIG. 9 is a cross-sectional view of the exemplary TFT array panel illustrating a processing step following the step shown in FIG. 8, FIG. 10 is a plan view layout of the exemplary TFT array panel in a processing step following the step shown in FIG. 9, FIG. 11 is a cross-sectional view of the exemplary TFT array panel shown in FIG. 10 taken along line XI-XI'-XI", FIG. 12 is a plan view layout of the exemplary TFT array panel in a processing step following the step shown in FIG. 10, and FIG. 13 is a cross-sectional view of the exemplary TFT array panel shown in FIG. 12 taken along line XIII-XIII'-XIII".

Referring to FIG. 3, a blocking film 111 is formed on an insulating substrate 110 made of a material such as transparent glass or plastic, for example, and then an amorphous silicon film 10 is formed on the blocking film 111 by chemical vapor deposition ("CVD").

Next, a sacrificial film 20 is formed on the amorphous silicon film 10, and is photo-etched to form an embossed surface thereon. The embossed surface has protrusions and depressions that are regularly disposed. The embossed surface may be formed by etching the sacrificial film 20 using a photoresist film having a different thickness dependent upon position.

The position-dependent thickness of the photoresist is obtained by several techniques, for example by providing translucent areas on the exposure mask as well as light transmitting areas and light blocking opaque areas. The translucent areas may have a slit pattern, a lattice pattern, a thin film(s) with intermediate transmittance or intermediate thickness may be used. When using a slit pattern, it is preferable that the width of the slits or the distance between the slits is smaller than the resolution of a light exposer used for the photolithography. Another example is to use a reflowable photoresist. In further detail, once a photoresist pattern made of a reflowable material is formed by using a normal exposure mask with only transparent areas and opaque areas, it is subject to a reflow process to flow onto areas without the photoresist, thereby forming thin portions.

The sacrificial film 20 may be made of a material such as $SiO_2$, SiNx or SiON having a thickness of about several tens to several thousands of angstroms (Å).

Referring to FIG. 4, a nickel (Ni) plate 30 is disposed on the sacrificial film 20 and is heat-treated for crystallizing the amorphous silicon film 10 and changing it to a polycrystalline film 40. The temperature of the heat-treatment is preferably in a range of about 400° C. to about 600° C.

As described above, since the nickel plate 30 is in contact with portions of the sacrificial film 20, nickel atoms move to the amorphous silicon film 10 through the contacted portions. Thereby the crystallization is started from some portions of the amorphous silicon film 10 due to the moved nickel atoms.

As described, since the amorphous silicon film 10 is not in direct contact with the nickel plate 30 and some of the nickel atoms are blocked by the sacrificial film 20, a minimum amount of the nickel atoms which is required to crystallize is transmitted to the amorphous silicon film 10. Hence, the amount of nickel atoms contained in the polycrystalline film 10 is reduced. Furthermore, due to the embossed surface of the sacrificial film 20 on which protrusions and depressions are regularly disposed, grain boundaries formed on the polycrystalline film 40 are regularly formed.

Referring to FIGS. 5 and 6, after removing the sacrificial film 20, the polycrystalline silicon film 40 is patterned to form a plurality of semiconductor islands 151.

As shown in FIGS. 7 and 8, a gate insulating layer 140 is formed by CVD on the substrate 110.

Thereafter, a metal film (not shown) is deposited by sputtering, etc., on the gate insulating layer 140, and then a photoresist pattern PR (FIG. 8) is disposed on the metal film. The metal film is etched using the photoresist pattern PR as an etch mask to form a plurality of gate lines 121 and a plurality of storage electrode lines 131. The gate lines 121 include gate electrodes 124a and 124b, and the storage electrode lines 131 include storage electrodes 133.

The etching time is sufficient for boundaries of the lines 121 and the storage electrode lines 131 to be positioned inside of the photoresist pattern PR.

Next, N-type or P-type impurity ions are heavily doped using the photoresist pattern PR as an ion injection mask to form a plurality of heavily doped extrinsic regions which include source or drain regions 153, 155 and 157 (FIG. 8).

Referring to FIG. 9, after the photoresist pattern PR is removed, N-type or P-type impurity ions are lightly doped into the semiconductor islands 151 using the gate lines 121 and the storage electrode lines 131 as an ion injection mask, to form a plurality of lightly doped extrinsic regions 152a and 152b.

Thereby, regions underlying the gate electrodes 124a and 124b become channel regions 154a and 154b, and regions between the gate electrodes 124a and 124b become the source/drain regions 157.

Alternatively, the lightly doped extrinsic regions 152a and 152b may be formed using metals having a different etching ratio or spacers formed on the sides of the storage electrode lines 131.

Next, referring to FIGS. 10 and 11, an interlayer insulating layer 160 is deposited on the entire surface of the substrate 110, and is photo-etched to form a plurality of contact holes 163 and 165 exposing the source and drain regions 153 and 155, respectively.

A plurality of data lines 171 and a plurality of output electrodes 175 which are connected to the source regions 153 and the drain regions 155 via the contact holes 163 and 165, respectively, are formed on the interlayer insulating layer 160.

As shown in FIGS. 12 and 13, a passivation layer 180 is deposited and photo-etched to remove some portions thereof, thereby forming contact holes 185 and 182 exposing the output electrodes 175 and end portions of the data lines 171, respectively.

As shown in FIGS. 1 and 2, a plurality of pixel electrodes 191, which are made of a transparent conductive material such as IZO and ITO, are formed on the passivation layer 180. The pixel electrodes 191 are connected to the output electrodes 175 through the contact holes 185.

According to the present invention, the amorphous silicon film is crystallized by a minimum ion amount required for crystallizing by forming the sacrificial film. Thereby, the nickel amount contained in the polycrystalline silicon film is reduced. Furthermore, since the sacrificial film includes the embossed surface, the grain boundaries formed on the polycrystalline silicon film are regularly disposed. Thereby, due to the regular grain boundaries, electrical and optical characteristics are uniform, and leakage current is reduced to provide TFT array panels of high quality.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film transistor array panel, the method comprising:
    forming an amorphous silicon film on an insulating substrate;
    forming a sacrificial film on the amorphous silicon film;
    etching the sacrificial film to form embossing patterns;
    contacting a metal plate with the sacrificial film after forming the embossing patterns;
    performing heat-treatment to change the amorphous silicon film to a polycrystalline silicon film.

2. A method of manufacturing a thin film transistor array panel, the method comprising:
    forming an amorphous silicon film on an insulating substrate;
    forming a sacrificial film on the amorphous silicon film;
    etching the sacrificial film to form embossing patterns;
    contacting a metal plate with the sacrificial film;
    performing heat-treatment to change the amorphous silicon film to a polycrystalline silicon film;
    removing the metal plate;
    removing the sacrificial film after removing the metal plate.

3. A method of manufacturing a thin film transistor array panel, the method comprising:
    forming an amorphous silicon film on an insulating substrate;
    forming a sacrificial film having a uniform embossed surface on the amorphous silicon film;
    contacting a metal plate with the sacrificial film having the uniform embossed surface and performing heat-treatment for crystallizing the amorphous silicon film to change the amorphous silicon film to a polycrystalline silicon film;
    removing the metal plate and the sacrificial film;
    patterning the polycrystalline silicon film to form a semiconductor;
    forming a gate insulating layer which covers the semiconductor;
    forming a gate line on the gate insulating layer, a portion of the gate line overlapping the semiconductor;
    heavily doping a conductive impurity into portions of the semiconductor to form at least one of a source region and drain region;
    forming an interlayer insulating layer which covers the gate line and the semiconductor; and
    forming a data line and an output electrode connected to the source and drain regions, respectively, on the interlayer insulating layer.

4. The method of claim 1, further comprising:
    removing the metal plate;
    removing the sacrificial film after removing the metal plate.

5. The method of claim 1, wherein the embossing patterns are arranged uniform.

6. The method of claim 1, further comprising:
    patterning the polycrystalline silicon film to form island patterns;
    forming a gate line on the insulating substrate;
    forming extrinsic region in parts of the island patterns by introducing impurities;
    forming an insulating layer between the gate line and the island pattern;
    forming an interlayer insulating layer which covers the gate line and the island pattern.

7. The method of claim 4, further comprising:
    patterning the polycrystalline silicon film to form a semiconductor;
    forming a gate insulating layer which covers the semiconductor;
    forming a gate line on the gate insulating layer, a portion of the gate line overlapping the semiconductor;
    heavily doping a conductive impurity into portions of the semiconductor to form at least one of a source region and drain region;
    forming an interlayer insulating layer which covers the gate line and the semiconductor; and
    forming a data line and an output electrode connected to the source and drain regions, respectively, on the interlayer insulating layer.

8. The method of claim 2, further comprising:
    patterning the polycrystalline silicon film to form a semiconductor;
    forming a gate insulating layer which covers the semiconductor;
    forming a gate line on the gate insulating layer, a portion of the gate line overlapping the semiconductor;
    heavily doping a conductive impurity into portions of the semiconductor to form at least one of a source region and drain region;
    forming an interlayer insulating layer which covers the gate line and the semiconductor; and
    forming a data line and an output electrode connected to the source and drain regions, respectively, on the interlayer insulating layer.

9. The method of claim 2, wherein the step contacting the metal plate with the sacrificial film is performed after the step etching the sacrificial film to form the embossing patterns.

10. The method of claim 9, wherein the embossing patterns are arranged uniform.

11. The method of claim 9, wherein the embossing patterns are arranged uniform.

12. The method of claim 3, wherein the embossed surface has protrusions and depressions which are regularly formed.

13. The method of claim 3, wherein the sacrificial film has a thickness of about several tens to about several thousands of angstroms.

14. The method of claim 3, wherein the sacrificial film is made of one of SiON, $SiO_2$ and $SiN_x$.

15. The method of claim 3, wherein the metal plate is a nickel plate.

16. The method of claim 3, wherein metal plate contacts a raised portion of the embossed surface.

* * * * *